(12) United States Patent
Bourdelle et al.

(10) Patent No.: US 8,058,158 B2
(45) Date of Patent: Nov. 15, 2011

(54) HYBRID SEMICONDUCTOR SUBSTRATE INCLUDING SEMICONDUCTOR-ON-INSULATOR REGION AND METHOD OF MAKING THE SAME

(75) Inventors: Konstantin Bourdelle, Crolles (FR); Bich-Yen Nguyen, Austin, TX (US); Mariam Sadaka, Austin, TX (US)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/726,800

(22) Filed: Mar. 18, 2010

(65) Prior Publication Data

US 2010/0289113 A1 Nov. 18, 2010

(30) Foreign Application Priority Data

May 18, 2009 (EP) .................................... 09290372

(51) Int. Cl.
*H01L 21/425* (2006.01)
*H01L 21/70* (2006.01)

(52) U.S. Cl. .................... 438/517; 438/527; 257/506

(58) Field of Classification Search .................. None
See application file for complete search history.

(56) References Cited

U.S. PATENT DOCUMENTS

| | | |
|---|---|---|
| 2005/0148144 A1 | 7/2005 | Chou et al. |
| 2007/0269963 A1 | 11/2007 | Cheng et al. |
| 2008/0217690 A1 * | 9/2008 | Mandelman et al. ......... 257/351 |
| 2008/0220595 A1 | 9/2008 | Lin et al. |
| 2009/0159932 A1 | 6/2009 | Pinto et al. |

FOREIGN PATENT DOCUMENTS

FR 2917235 A1 12/2008

OTHER PUBLICATIONS

Yamaoka et al., IEEE Journal of Solid-State Circuits, vol. 41, No. 11, Nov. 2006, pp. 2366-2372.
European Search Report and Opinion for European Application No. 09290372.3 dated Oct. 15, 2009, 5 pages.

* cited by examiner

*Primary Examiner* — Scott B Geyer
(74) *Attorney, Agent, or Firm* — TraskBritt

(57) ABSTRACT

A method for manufacturing a hybrid semiconductor substrate comprises the steps of (a) providing a hybrid semiconductor substrate comprising a semiconductor-on-insulator (SeOI) region, that comprises an insulating layer over a base substrate and a SeOI layer over the insulating layer, and a bulk semiconductor region, wherein the SeOI region and the bulk semiconductor region share the same base substrate; (b) providing a mask layer over the SeOI region; and (c) forming a first impurity level by doping the SeOI region and the bulk semiconductor region simultaneously such that the first impurity level in the SeOI region is contained within the mask. Thereby, a higher number of process steps involved in the manufacturing process of hybrid semiconductor substrates may be avoided.

18 Claims, 6 Drawing Sheets

HYBRID SEMICONDUCTOR SUBSTRATE INCLUDING SEMICONDUCTOR-ON-INSULATOR REGION AND METHOD OF MAKING THE SAME

PRIORITY CLAIM

This application claims the benefit of the filing date of European Patent Application Serial No. EP 09290372.3, filed May 18, 2009 and entitled "Fabrication Process of a Hybrid Semiconductor Substrate," which is incorporated herein in its entirety by this reference.

TECHNICAL FIELD

The present invention relates to a fabrication process of a hybrid semiconductor substrate, and more particularly, relates to simultaneous fabrication of hybrid semiconductor substrates.

BACKGROUND

A semiconductor device, in which a semiconductor-on-insulator (SeOI) region and a bulk semiconductor region are formed on an upper surface of a semiconductor base substrate, wherein the SeOI region comprises a buried insulating oxide layer (BOX) and a thin semiconductor layer, is known as a hybrid semiconductor device. Such a device may be used in memory cell.

FIG. 1 is a cross-sectional view of a known hybrid semiconductor device 101 like, for example, disclosed in Yamaoka et al., *IEEE Journal of Solid-State Circuits*, Vol. 41, No. 11, pp. 2366-2372, Nov. 2006.

As shown in FIG. 1, the hybrid semiconductor device 101 includes a SeOI region 113 comprising a BOX layer 105 and a SeOI layer 107 formed on a bulk substrate 103 and a bulk semiconductor region 111 formed on the same bulk substrate 103. The SeOI region 113 and the bulk semiconductor region 111 are usually separated from each other by a shallow trench isolation (STI) 123.

Devices comprising SeOI regions offer several advantages over more conventional semiconductor devices. For example, SeOI devices may have lower parasitic capacitances and lower power consumption requirements than non-SeOI devices that perform similar tasks and thereby provide faster switching times for the resultant circuits. Since the SeOI region may be provided with an ultra-thin BOX layer, threshold voltage (Vt) may be controlled by changing the voltage of an underlying well and, hence, it enables back-gate control with low bias voltage. The back-gate bias is applied through a well contact formed through the BOX layer, wherein the wells within the SeOI region and the bulk semiconductor region are separated from each other by STIs.

However, the hybrid semiconductor devices such as the conventional device have the following drawbacks. Unlike the bulk semiconductor region, the body of the SeOI region is usually not connected to a specific reference potential that may allow minority charge carriers to accumulate in that region and, hence, a floating body potential may exist in the SeOI region. This phenomenon leads to a variation in the threshold voltage (Vt) of the semiconductor devices. In particular, for static random access memory (SRAM) cells, the threshold voltage fluctuations may result in significant instabilities of the devices, which may not be tolerable in view of data integrity of the memory cells.

Further, it is known to implant three different concentrations of dopants (n-type or p-type) in a given region to form a channel of a metal-oxide-semiconductor field effect transistor (MOSFET) in a bulk substrate. The three different concentrations of dopants lead to three levels of doping: a shallow level called "Vt-doping," a deeper level called "ground plane" (GP) doping and an even deeper level called "well doping." On the other hand, doping in the SeOI region is used to form the back side electrodes of the SeOI transistors. Formation of the back side electrodes is achieved with different implant conditions, thus, also with a different mask.

Therefore, the fabrication of a hybrid semiconductor substrate, comprising a SeOI region and a bulk semiconductor region, requires different implant conditions for each region. The process cost and time for the fabrication thus increases due to the need of a plurality of different masks to be able to carry out the implant steps in both the SeOI region and the bulk semiconductor region and, thereby, a greater number of process steps.

BRIEF SUMMARY OF THE INVENTION

It is therefore the object of the present invention to provide an improved manufacturing process of a hybrid semiconductor substrate.

This object is achieved with a method for manufacturing a hybrid semiconductor substrate comprising the steps of: (a) providing a hybrid semiconductor substrate comprising a semiconductor-on-insulator (SeOI) region, that comprises an insulating layer over a base substrate and a SeOI layer over the insulating layer, and a bulk semiconductor region, wherein the SeOI region and the bulk semiconductor region share the same base substrate; (b) providing a mask layer over the SeOI region, and (c) forming a first impurity level by doping the SeOI region and the bulk semiconductor region simultaneously such that the first impurity level in the SeOI region is contained within the mask layer.

With the abovementioned method for manufacturing according to the invention, both regions of the hybrid semiconductor substrate may be doped using the same implant conditions, which simplifies the manufacturing process of hybrid semiconductor substrates. As the implant profile is contained within the mask layer, a perturbation of this zone of the semiconductor material by the dopant may be prevented after a mask removal.

Preferably, the method for manufacturing the hybrid semiconductor substrate may further comprise a step of: (d) forming a second impurity level by doping the SeOI region and the bulk semiconductor region simultaneously, such that the second impurity level in the SeOI region is under the insulating layer and within the base substrate. Such an implant profile helps in suppressing the threshold voltage (Vt) fluctuations in transistors in the SeOI region and, in case the obtained hybrid substrate is used in static random access memory (SRAM) applications, an improved SRAM stability can be achieved.

Advantageously, the method for manufacturing the hybrid semiconductor substrate may further comprise a step of: (e) forming a third impurity level by doping the SeOI region and the bulk semiconductor region simultaneously such that the third impurity level in the SeOI region is below the second impurity level within the base substrate and further away from the insulating layer. Such an implant profile helps in suppressing the threshold voltage (Vt) fluctuations in the SeOI regions and, hence, improves SRAM stability. Furthermore, a simultaneous creation of back side electrodes in the SeOI regions and channels of the transistors in the bulk semiconductor regions in the hybrid semiconductor substrate can be achieved.

According to a preferred embodiment, the method for manufacturing the hybrid semiconductor substrate may further comprise the steps of: (f) providing a SeOI substrate; forming the mask layer on the SeOI substrate; and removing a predetermined area of the mask, the underlying SeOI layer and the underlying insulating layer to obtain the bulk semiconductor region. Thus, the bulk semiconductor region and the SeOI region may be formed starting from the same SeOI substrate. Compared to the prior art technique of the epitaxial layer overgrowth that can be used to obtain silicon-on-insulator (SOI) islands within a silicon (Si) bulk starting from a bulk substrate, the inventive method provides a simpler process and less crystal defects.

Preferably, the method for manufacturing the hybrid semiconductor substrate may further comprise a step (g) of providing a second mask with a predetermined pattern over the hybrid semiconductor substrate to prevent the formation of an impurity level in the area masked by the second mask during at least one of steps c), d) and e). Thus, only one mask needs to be provided per transistor type (n- or p-type) in the bulk semiconductor region, while simultaneously the back side electrodes of transistors in the SeOI region may be formed. In addition, for the fabrication of the other type of transistors in the bulk semiconductor region, only one additional mask is necessary. Thus, the process may be further optimized such that a lower cost of manufacturing can be achieved. The additional mask may be a standard photolithography mask (e.g., photoresist).

Preferably, the method for manufacturing a hybrid semiconductor substrate may further comprise a step (h) of removing the mask layer from the SeOI region after step c). By doing so, the first impurity level can be removed, which might not be useful for the formation of the electronic devices in the SeOI region. Indeed, the abovementioned first impurity level present in the bulk semiconductor region should be kept away from the top layer of the SeOI region. Preferably, and according to this invention, the channels of electronic devices formed in the SeOI region can thus be kept undoped.

According to a preferred embodiment, the mask layer and/or the insulating layer may be made of an oxide, in particular, deposited by a chemical vapor deposition (CVD) process. Such a mask layer is thus easy to obtain and, furthermore, suitable to trap the dopants. A deposited silicon nitride layer, or combination of deposited oxide and nitride layers, may be used as a mask. A CVD oxide is, however, the most practical from a technological point-of-view.

Advantageously, the method for manufacturing the hybrid semiconductor substrate may comprise a step (i) of providing a spacer in an edge region of the SeOI region adjacent to the bulk semiconductor region such that the spacer extends at least from the surface of the base substrate to the SeOI layer. The spacer can protect the SeOI layer and the insulating layer of the SeOI region from damage while the mask layer is removed from the hybrid semiconductor substrate, e.g., by etching, during step (h). According to another embodiment, the spacer may be removed after step (h), e.g., by a wet etch using phosphoric acid.

Preferably, the material of the spacer may be different than the one of the mask layer and/or the insulating layer, preferably the material of the spacer is a nitride. For materials having different etching properties, like nitride compared to an oxide, it is possible to protect the insulating layer during etching of the mask layer.

According to an advantageous embodiment, the mask layer may have a thickness of at least 20 nm. In particular, the thickness of the mask layer is not less than 20 nm and not more than 30 nm. By having a mask layer of such a thickness, the first impurity level in the bulk semiconductor region may form a shallow impurity region forming the so called "Vt-doping level, whereas the second deeper level may form the ground plane (GP) doping level and, if present, the third level may form the so called "well-doping" level, so that a channel of a MOSFET transistor may be formed in the bulk semiconductor region of the hybrid semiconductor substrate.

Advantageously, the SeOI layer may have a thickness of at most 20 nm, in particular, the thickness of the SeOI layer is not less than 10 nm and not more than 20 nm, and/or the insulating layer may have a thickness of at most 20 nm, in particular, the thickness of the insulating layer is not less than 10 nm and not more than 20 nm. By having such a thin SeOI layer and a thin insulating layer, the ground plane and, if present, the well-doping level in the SeOI region of the hybrid semiconductor substrate may be positioned under the insulating layer, while at the same time, those implant levels may be provided at correct depths within the bulk semiconductor region. Thus, characteristics such as suppression of threshold voltage fluctuations and, hence, SRAM stability can be achieved.

Preferably, the method for manufacturing the hybrid semiconductor substrate may further comprise a step of providing a shallow trench isolation (STI) to separate the SeOI region and the bulk semiconductor region. By having such a STI, the well regions of the SeOI region and the bulk semiconductor region may be separated and, thus, the back-gate voltage of each region can be better controlled.

The object of the invention is also achieved with a hybrid semiconductor substrate comprising: a semiconductor-on-insulator (SeOI) region, comprising a base substrate, an insulating layer over the base substrate, a SeOI layer over the insulating layer and a mask layer over the SeOI layer, a bulk semiconductor region provided adjacent to the SeOI region, and a first impurity region in the SeOI region and the bulk semiconductor region wherein the first impurity region in the SeOI region is contained within the mask layer. With the above-mentioned hybrid semiconductor substrate, the implant profile is contained within the mask layer and it becomes possible to simultaneously create back side electrodes on the SeOI region and channels of the transistors in the bulk semiconductor regions of the hybrid semiconductor substrate.

Advantageously, the hybrid semiconductor substrate may furthermore comprise: a second impurity region in the SeOI region and the bulk semiconductor region wherein the second impurity region in the SeOI region is under the insulating layer and within the base substrate. By having such an impurity region under the insulating layer, threshold voltage (Vt) fluctuations may be suppressed and, hence, SRAM stability can be achieved.

Preferably, the hybrid semiconductor substrate may comprise: a third impurity region in the SeOI region and the bulk semiconductor region, wherein the third impurity region in the SeOI region is below the second impurity region within the base substrate and further away from the insulating layer. By having such an impurity region under the insulating layer, threshold voltage (Vt) fluctuations may be suppressed and, hence, SRAM stability can be achieved.

BRIEF DESCRIPTION OF THE DRAWINGS

Advantageous embodiments of the inventive method will be described in the following by referring to the figures.

DETAILED DESCRIPTION OF THE INVENTION

In the following, features and advantageous embodiments of the method and the device according to the invention will be described in detail.

Figure 1:
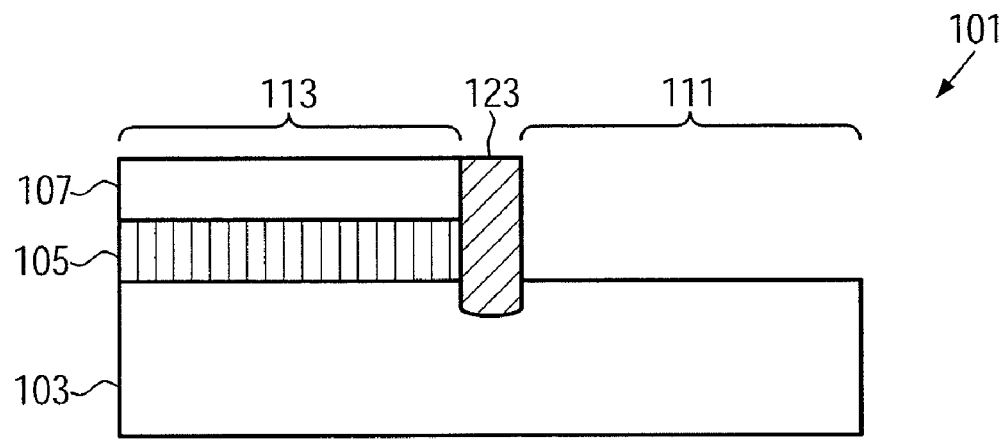
FIG. 1 illustrates a cross-sectional view of a conventional hybrid semiconductor device known from the prior art.
Figure 2:
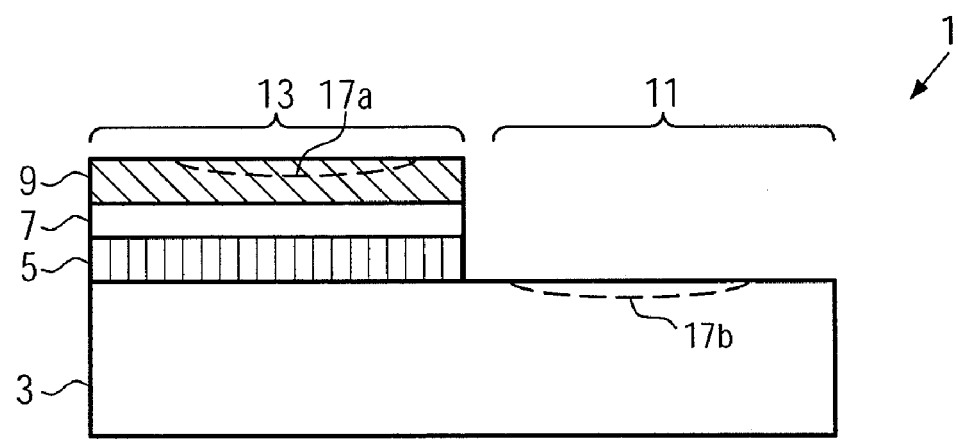
FIG. 2 illustrates a cross-sectional view of a hybrid semiconductor substrate according to a first embodiment.

FIG. 2 illustrates a hybrid semiconductor substrate 1 according to a first embodiment of the invention. The fabrication method to manufacture the hybrid semiconductor substrate 1 will be described with respect to FIGS. 3a-3d.

The hybrid semiconductor substrate 1 comprises a base substrate 3 with a semiconductor-on-insulator (SeOI) region 13 that comprises an insulating layer 5, a semiconductor layer 7 also called a SeOI layer, and a mask layer 9.

The hybrid semiconductor substrate 1 furthermore comprises a bulk semiconductor region 11 adjacent to the SeOI region 13 and that shares the same base substrate 3.

In this embodiment, the base substrate 3 is a Si wafer, the insulating layer 5 is a silicon oxide layer, also called a buried oxide layer (BOX), and the SeOI layer 7 is a silicon containing layer. The material choice is nevertheless non-limiting and other suitable materials, like germanium, gallium, arsenide, etc., may find application for the substrate 3 and the SeOI layer 7. Regarding the insulating layer 5, other insulating materials rather than silicon oxide may also be used.

The thickness of the SeOI layer 7 in this embodiment has a value of at most 20 nm, in particular, a thickness from about 10 nm to about 20 nm. The insulating layer 5 has a thickness of at most 20 nm, in particular, a thickness from about 10 nm to about 20 nm.

According to the invention, the SeOI region 13 further comprises a mask layer 9 over the SeOI layer 7. The mask layer 9 in this embodiment is a silicon oxide. In this context, an oxide deposited by chemical vapor deposition (CVD) is preferred. A deposited silicon nitride layer or combination of deposited oxide and nitride layers may also be used as the mask layer 9. The mask layer 9 has a thickness of at least 20 nm, in particular, with a thickness between about 20 nm and about 30 nm.

The hybrid semiconductor substrate 1 further comprises a first impurity level 17a in the SeOI region 13 and a first impurity level 17b in the bulk semiconductor region 11, wherein the first impurity level 17a in the SeOI region 13 is contained within the mask layer 9.

FIGS. 3a-3d illustrate a method for manufacturing the hybrid semiconductor substrate 1 of the first embodiment illustrated in FIG. 2.

Figure 3A:
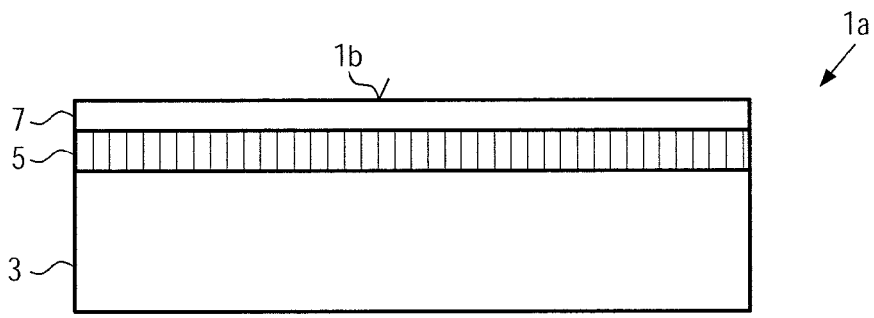
FIGS. 3a-3h illustrate a method for manufacturing the hybrid semiconductor substrate of the first embodiment of FIG. 2.

FIG. 3a illustrates a semiconductor-on-insulator (SeOI) substrate 1a. The SeOI substrate 1a, in this embodiment, comprises the base substrate 3, the insulating layer 5 over the base substrate 3 and the SeOI layer 7 over the insulating layer 5. The SeOI substrate 1a may, for example, be obtained by SMARTCUT® technology, or any other suitable semiconductor-on-insulator manufacturing method. The SeOI substrate 1a may have any suitable size or form such as, for example, 200 mm or 300 mm type wafer. The layers 3, 5 and 7 have the properties concerning material and thickness such as previously mentioned above with respect to FIG. 2.

Prior to the following process steps, the surface 1b of the SeOI substrate 1a may be cleaned using, for instance, a Radio Corporation of America (RCA) cleaning.

Figure 3B:
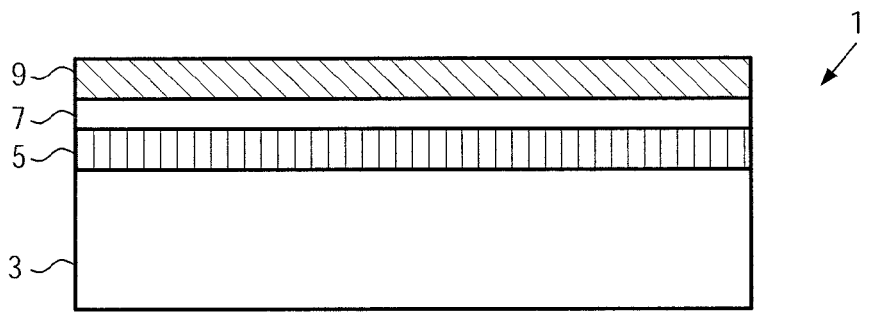

Referring to FIG. 3b, the inventive method for manufacturing the hybrid semiconductor substrate 1, in the first embodiment, comprises a step of providing a mask layer 9 over the surface 1b of the SeOI substrate 1a. The mask layer 9 is an oxide layer, in particular, a silicon oxide layer. In this context, an oxide deposited by chemical vapor deposition is preferred. A deposited silicon nitride layer, or combination of deposited oxide and nitride layers, may also be used as the mask layer 9 according to another embodiment. The mask layer 9 is deposited over a surface 1b of the SeOI substrate 1a, for example, by a chemical vapor deposition (CVD) process. The mask layer 9 has a thickness of at least 20 nm, in particular, with a thickness between about 20 nm and about 30 nm.

Figure 3C:
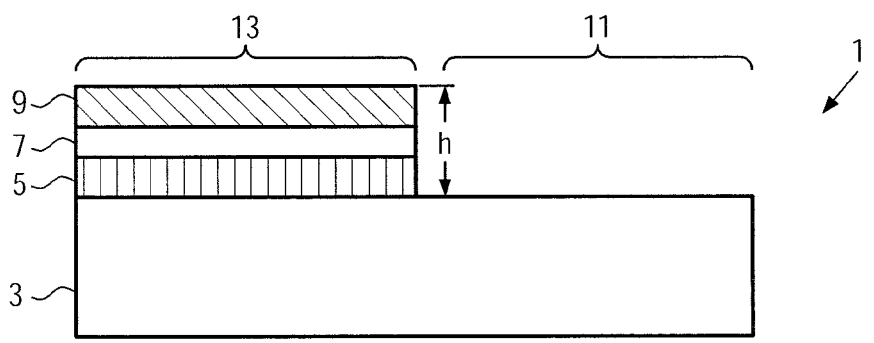

Referring to FIG. 3c, the inventive method for manufacturing the hybrid semiconductor substrate 1, in the first embodiment, further comprises a step of removing, for example, by plasma etching, a predetermined area of the mask layer 9, the underlying SeOI layer 7 and the underlying insulating layer 5 to obtain a bulk semiconductor region 11, as illustrated in FIG. 2. The region other than the bulk semiconductor region 11, thus without material removal, forms the SeOI region 13, as illustrated in FIG. 2. Thus, the bulk semiconductor region 11 and the SeOI region 13 are formed starting from the same SeOI substrate 1a. The dimensions of the predetermined area removed above are determined, for example, by the circuit design. The order of magnitude of the predetermined area may be, for example, several square micrometers.

According to a variant of the first embodiment, the steps illustrated in FIG. 3b and FIG. 3c may be exchanged. Thus, the bulk semiconductor region 11 may also be formed by removing only a predetermined area of the underlying SeOI layer 7 and the underlying insulating layer 5 and the mask layer 9 may then be formed independently over the SeOI region 13.

A step height h, as shown in FIG. 3c, between about 40 nm and about 70 nm, may be observed between the bulk semiconductor region 11 and the SeOI region 13. This is, however, not an issue for the subsequent process steps, such as photolithography.

Figure 3D:
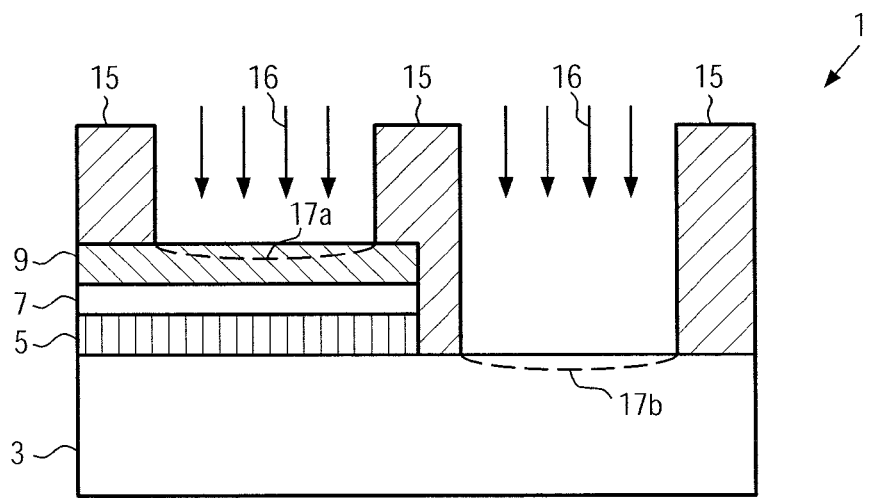

Referring to FIG. 3d, the inventive method for manufacturing the hybrid semiconductor substrate 1, in the first embodiment, further comprises a step (g) of providing a second mask 15 with a predetermined pattern over the hybrid semiconductor substrate 1. This second mask 15 provides the pattern for the doping steps. Indeed, the second mask 15 prevents the formation of an impurity level in the underlying area masked by the second mask 15.

Figure 7:
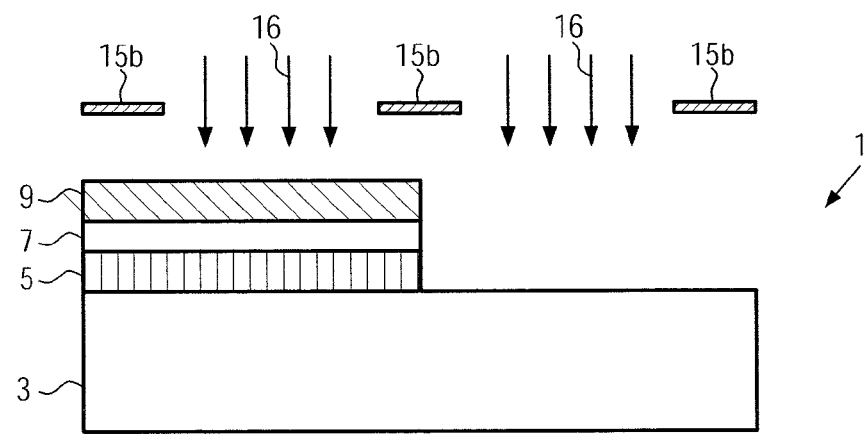
FIG. 7 illustrates a further variant of the first embodiment.

The second mask 15 does not necessarily have to be in contact with the surface of the bulk semiconductor region 11 and/or SeOI region 13. According to another embodiment, a contact-less mask 15b may also be used as the second mask 15, as illustrated in FIG. 7.

Subsequent to providing the second mask 15, still referring to FIG. 3d, the inventive method for manufacturing the hybrid semiconductor substrate 1 in the first embodiment, further comprises a step of forming a first impurity level 17a, 17b by doping the SeOI region 13 and the bulk semiconductor region 11 simultaneously using preferably ion implantation. The ion implantation 16 is performed such that the first impurity level 17a in the SeOI region 13 is contained within the mask layer 9. The doping levels are typically determined by the standard technology nodes. Preferred dopant species are phosphorus (P), boron (B), arsenic (As), etc., at energies between, for example, 10 keV-500 keV and with doses of, e.g., $5 \times 10^{12}$-$5 \times 10^{13}$ atoms per $cm^2$. The doping is called a Vt-doping and creates a shallow impurity level 17a in the SeOI region 13 and a shallow impurity level 17b in the bulk semiconductor region 11 that may be used for suppressing the threshold voltage (Vt) variations.

Figure 3E:
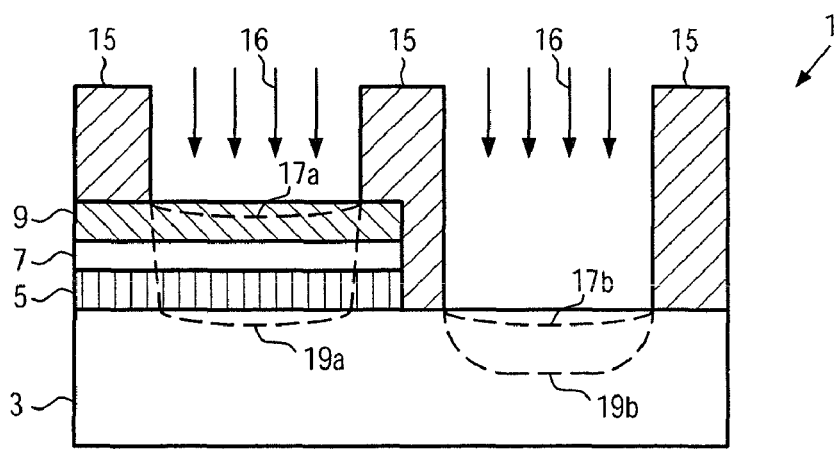

Referring to FIG. 3e, the inventive method for manufacturing the hybrid semiconductor substrate 1, in the first embodiment, further comprises a step of forming a second impurity level 19a, 19b by doping the SeOI region 13 and the bulk semiconductor region 11 simultaneously again using ion implantation. The ion implantation 16 is performed such that the second impurity level 19a in the SeOI region 13 is under the insulating layer 5 and within the bulk semiconductor substrate 3. The doping is a so called "ground plane" (GP) doping and, thus, creates an impurity level 19a, 19b that is deeper than the first impurity level 17a in the SeOI region 13 and the first impurity level 17b in the bulk semiconductor region 11.

Figure 3F:
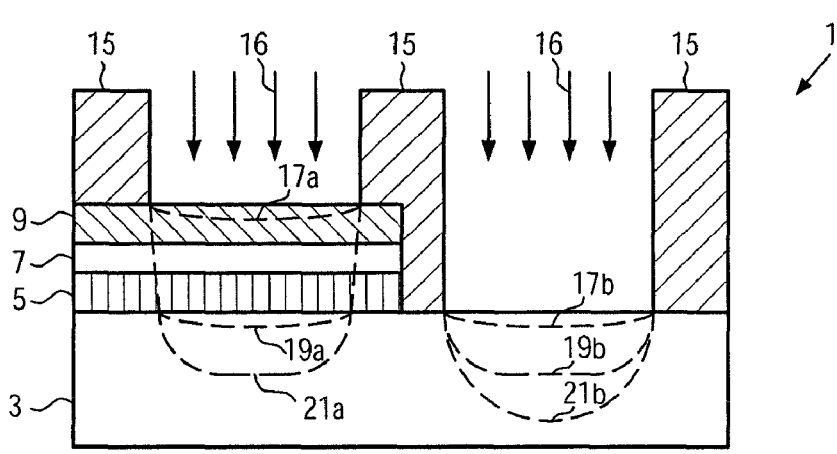

Referring to FIG. 3f, the inventive method for manufacturing the hybrid semiconductor substrate 1, in the first embodiment, further comprises a step of forming a third impurity level 21a, 21b by doping the SeOI region 13 and the bulk semiconductor region 11 simultaneously again using ion implantation. The ion implantation is performed such that the third impurity level 21a in the SeOI region 13 is below the second impurity level 19a within the base substrate 3 and further away from the insulating layer 5. The doping is a so called "well-doping" and, thus, creates a deeper impurity level than the second impurity level 19a in the SeOI region 13 and the second impurity level 19b in the bulk semiconductor region 11.

According to another embodiment, the sequence of the ion implantation steps illustrated in FIGS. 3d-3f may be exchanged, thus, the steps may be performed in any order.

Figure 5:
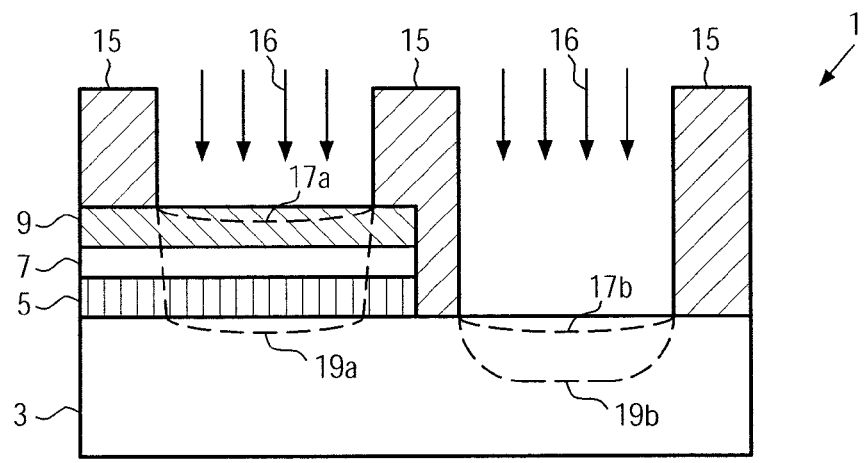
FIG. 5 illustrates the steps of providing impurity levels according to a variant of the first embodiment, wherein the two implantation steps illustrated in FIGS. 3d and 3e, respectively, are replaced by a single implantation step.

According to a further variant of the first embodiment, the steps (d) and (e) may be replaced by a single doping step, so as to form a single deeper doping level. That is, the inventive method for manufacturing the hybrid semiconductor substrate 1, according to an alternative embodiment as shown in FIG. 5, may comprise two doping steps of (1) forming a first impurity level 17a, 17b by doping the SeOI region 13 and the bulk semiconductor region 11 simultaneously, as illustrated in FIG. 3d, and (2) forming another impurity level 19a, 19b by doping the SeOI region 13 and the bulk semiconductor region 11 simultaneously.

The simultaneous doping is done such that the impurity level 19a in the SeOI region 13 is under the insulating layer 5 and within the base substrate 3. The doping is a deeper level doping and thus, creates a deeper impurity level than the first impurity level 17a in the SeOI region 13 and the first impurity level 17b in the bulk semiconductor region 11. Thus, according to this embodiment, the bulk transistor in the bulk semiconductor region 11 may comprise just two impurity levels.

The second mask 15 is then removed after the abovementioned implantation steps, e.g., by etching.

Figure 3G:
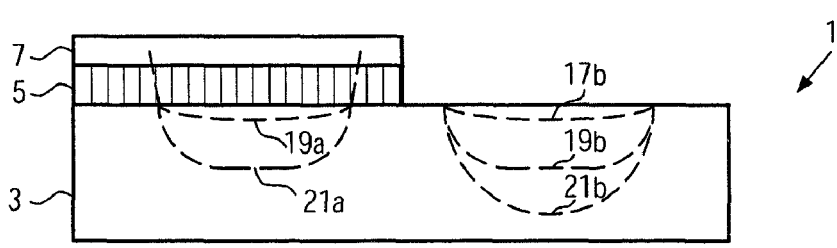

Referring to FIG. 3g, the inventive method for manufacturing the hybrid semiconductor substrate 1, in the first embodiment, further comprises a step of removing the mask layer 9 from the SeOI region 13. By doing so, the first impurity level 17a is removed. This is typically not useful for the formation of the electronic devices in the SeOI region 13. The mask layer 9 is typically removed by etching. For the oxide mask, usually a hydrofluoric acid (HF) dip and for nitride, for example, phosphoric acid ($H_3PO_4$) may be used. The dopants in the mask layer 9 have the positive side effect that the etching is achieved faster than in case of an undoped mask layer 9.

Thus, a hybrid semiconductor substrate is achieved in which SeOI transistors formed in the SeOI region 13 comprise two impurity levels 19a, 21a, whereas transistors in the bulk semiconductor region 11, comprise three impurity levels 17b, 19b, 21b.

Figure 3H:
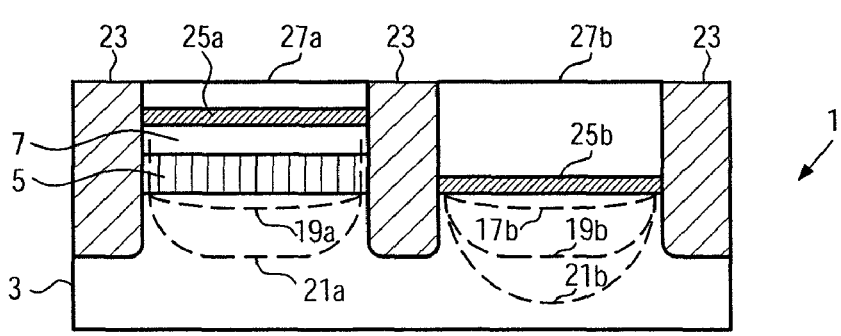

Referring to FIG. 3h, the inventive method for manufacturing the hybrid semiconductor substrate 1, in the first embodiment, further comprises a step of providing a shallow trench isolation (STI) 23 between the bulk semiconductor region 11 and the SeOI region 13 (FIG. 2), in particular, between electronic devices formed therein, to prevent current leakage between the regions 11 and 13. The regions above the implanted impurity levels 19a, 21a, 17b, 19b, 21b and between the STIs 23 are filled by an oxide layer, preferably, CVD deposited silicon oxide 25a, 25b and a nitride 27a, 27b. The STI densification is at the same time used as an implant activation anneal step.

With the above-described manufacturing process, it becomes possible to obtain a hybrid semiconductor substrate 1 in a cost effective manner for the following reasons: both regions of the hybrid semiconductor substrate 1, the bulk semiconductor region 11 and the SeOI region 13 are doped under the same implant conditions using a single doping mask 15. Thus, only one protective mask needs to be provided per transistor type (n- or p-type) in the bulk semiconductor region 11, while simultaneously creating the back side electrodes of transistors in the SeOI region 13. For the fabrication of the other type of transistors in the bulk semiconductor region 11, only one additional mask is necessary. Thus, the process for manufacturing a hybrid semiconductor substrate may further be optimized such that a lower cost manufacturing can be achieved.

As the first impurity level 17a, which is not needed for the devices, is contained within the mask layer 9, it may be removed together with the mask layer 9 after any one of the implantation steps illustrated in FIGS. 3d, 3e and 3f. Thus, the mask layer 9 may just be seen as a sacrificial layer.

Furthermore, the implantations conditions may be adjusted such that the deeper impurity level 19a or 21a in the SeOI region 13 is under the insulating layer 5 and within the base substrate 3. Such an implant profile helps in suppressing the threshold voltage (Vt) fluctuations in transistors in the SeOI region 13 and, in case the obtained hybrid semiconductor substrate 1 is used in SRAM applications, an improved SRAM stability can also be achieved.

A second embodiment of the inventive method is illustrated in FIGS. 4a-4h. Compared to the first embodiment, an additional spacer 29 is provided in an edge region of the SeOI region 13 adjacent to the bulk semiconductor region 11. The additional spacer 29 extends at least from the surface of the bulk semiconductor substrate 3 to the SeOI layer 7.

The second embodiment comprises essentially the same process steps as in the first embodiment, and therefore the description of the steps illustrated in FIGS. 4a, 4b, 4d, 4e, 4f and 4h is not repeated again but is incorporated herewith by reference. Elements having the same reference numerals in FIGS. 3a-3h and FIGS. 4a-4h correspond to each other, and their properties are therefore not repeated again in the description of this embodiment, but are incorporated herewith by reference.

Figure 4A:
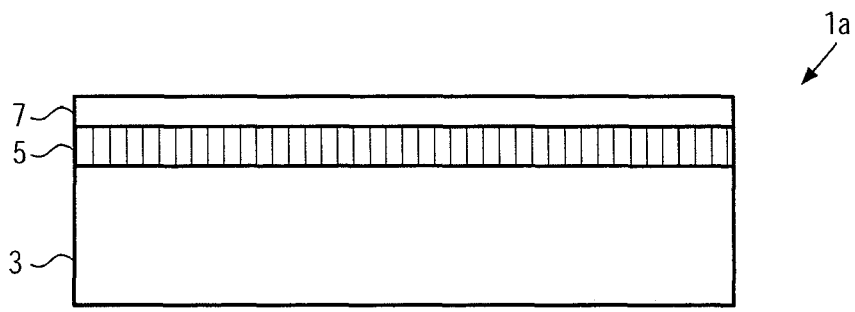
FIGS. 4a-4h illustrate a method for manufacturing the hybrid semiconductor substrate according to a second embodiment.
Figure 4B:
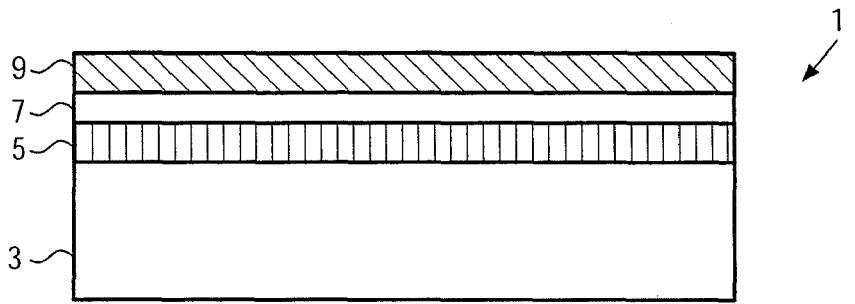
Figure 4C:
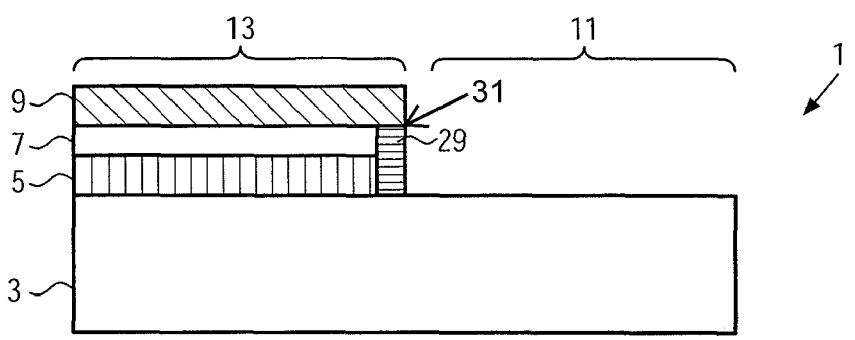
Figure 4D:
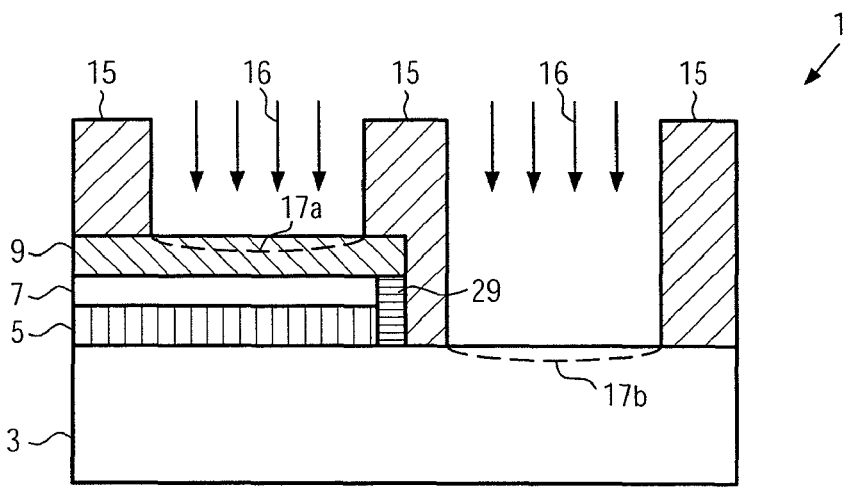
Figure 4E:
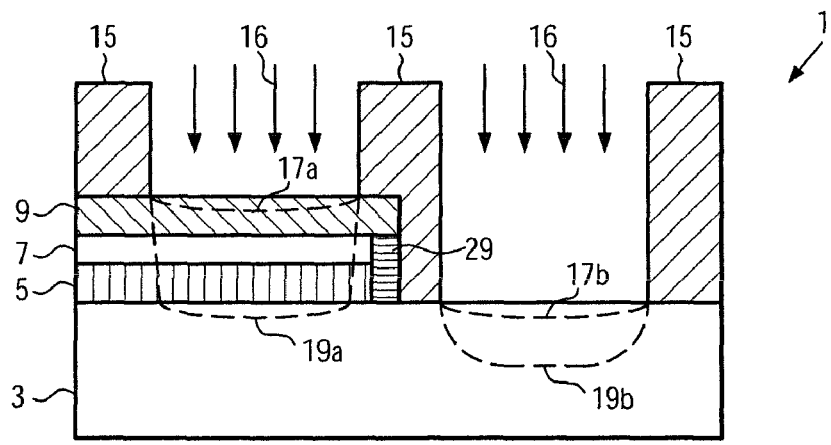
Figure 4F:
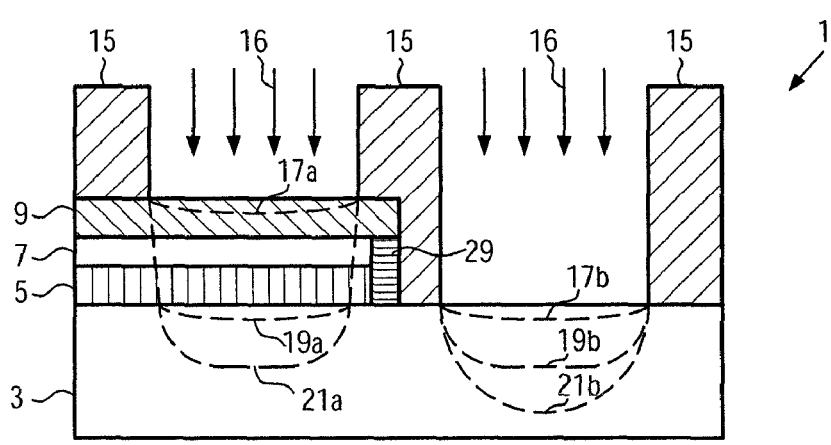

According to the second embodiment, the inventive method for manufacturing the hybrid semiconductor substrate 1 comprises a step of providing a spacer 29 in an edge region of the SeOI region 13 adjacent to the bulk semiconductor region 11, as illustrated in FIG. 4c. The spacer 29 extends at least from the surface of the base substrate 3 to an interface 31 between the SeOI layer 7 and the mask layer 9.

Figure 4G:
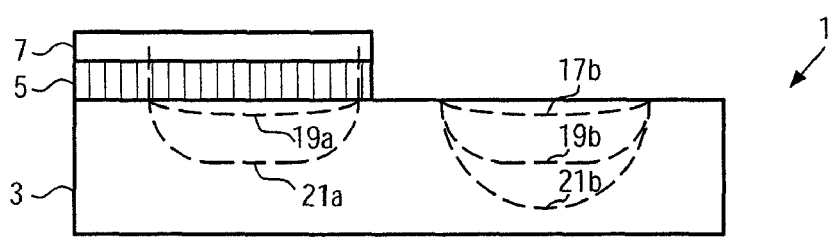
Figure 4H:
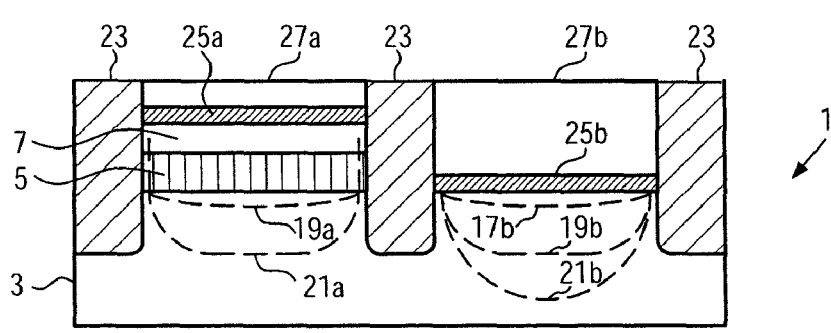

The spacer 29 protects the SeOI layer 7 and the insulating layer 5 of the SeOI region 13 from damage while the mask layer 9 is removed from the hybrid semiconductor substrate 1, e.g., by etching, during the step (h) illustrated in FIG. 3g and FIG. 4g.

According to this embodiment, the spacer 29 is a nitride. A nitride is one example of a suitable material to protect the insulating layer 5 during etching of the mask layer 9, as it has different etching properties compared to the oxide used for the mask layer 9 and the insulating layer 5. This effect is thus achieved for any material choice for the spacer 29 and the mask layer 9 that have different etching properties.

Figure 6:
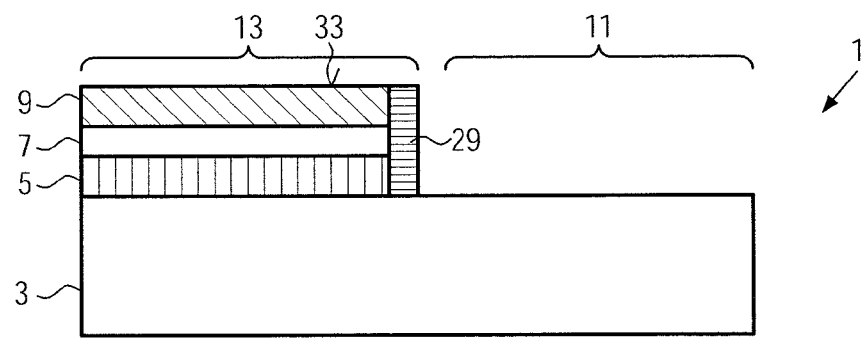
FIG. 6 illustrates a step of providing a spacer according to a variant of the second embodiment as illustrated in FIG. 4c.

According to a variant of the second embodiment, illustrated in FIG. 6, the spacer 29 extends at least from the surface of the base substrate 3 to the upper surface 33 of the mask layer 9.

As illustrated in FIG. 4g, the spacer 29 is removed, e.g., by a wet etch using phosphoric acid after the removal of the second mask 15 and the mask layer 9.

The second embodiment of the manufacturing process according to the invention has an additional advantage, such that an undercutting of the insulating layer 5 and the SeOI layer 7 during etching of the mask layer 9 can be prevented.

Thus, with the above-disclosed embodiments and alternatives of the manufacturing process of a hybrid semiconductor substrate, it is possible to achieve a manufacturing process that is less costly to perform as for doping of both regions as only one mask needs to be provided. Furthermore, it is at the same time possible to control the electrical characteristics of the devices formed on the hybrid semiconductor substrate.

What is claimed is:

1. A method of manufacturing a hybrid semiconductor substrate, the method comprising:
    providing a hybrid semiconductor substrate comprising a semiconductor-on-insulator (SeOI) region and a bulk semiconductor region sharing a common base substrate, the SeOI region comprising an insulating layer and a SeOI layer over the insulating layer;
    providing a mask layer over the SeOI region;
    forming a first impurity level by doping the SeOI region and the bulk semiconductor region simultaneously such that the first impurity level in the SeOI region is contained within the mask layer; and
    forming a second impurity level by doping the SeOI region and the bulk semiconductor region simultaneously such that the second impurity level in the SeOI region is under the insulating layer and within the base substrate.

2. The method of claim 1, further comprising:
    forming a third impurity level by doping the SeOI region and the bulk semiconductor region simultaneously such that the third impurity level in the SeOI region is below the second impurity level within the base substrate and further away from the insulating layer.

3. The method of claim 2, wherein providing the hybrid semiconductor substrate and providing the mask layer comprises:
    providing a semiconductor-on-insulator (SeOI) substrate;
    forming the mask layer on the SeOI substrate; and
    removing a predetermined area of the mask layer, the underlying SeOI layer and the underlying insulating layer to obtain the bulk semiconductor region.

4. The method of claim 3, further comprising:
    providing a second mask with a predetermined pattern over the hybrid semiconductor substrate to prevent formation of an impurity level in an area masked by the second mask while forming the first impurity level.

5. The method of claim 4, further comprising:
    removing the mask layer from the SeOI region after forming the first impurity level.

6. The method of claim 1, wherein providing the hybrid semiconductor substrate and providing the mask layer comprises:
    providing a semiconductor-on-insulator (SeOI) substrate;
    forming the mask layer on the SeOI substrate; and
    removing a predetermined area of the mask layer, the underlying SeOI layer and the underlying insulating layer to obtain the bulk semiconductor region.

7. The method of claim 1, further comprising:
    providing a second mask with a predetermined pattern over the hybrid semiconductor substrate to prevent the formation of an impurity level in an area masked by the second mask while forming the first impurity level.

8. The method of claim 1, further comprising:
    removing the mask layer from the SeOI region after forming the first impurity level.

9. The method of claim 1, wherein at least one of the mask layer and the insulating layer is made of an oxide.

10. The method of claim 1, further comprising:
    providing a spacer in an edge region of the SeOI region adjacent to the bulk semiconductor region such that the spacer extends at least from the surface of the base substrate to the SeOI layer.

11. The method of claim 10, further comprising removing the spacer.

12. The method of claim 10, wherein the spacer is made of a different material than the mask layer.

13. The method of claim 1, wherein the mask layer has a thickness of at least 20 nm.

14. The method of claim 1, further comprising providing a shallow trench isolation (STI) separating the SeOI region and the bulk semiconductor region.

15. A method of manufacturing a hybrid semiconductor substrate, the method comprising:
    providing a hybrid semiconductor substrate comprising a semiconductor-on-insulator (SeOI) region and a bulk semiconductor region sharing a common base substrate, the SeOI region comprising an insulating layer and a SeOI layer over the insulating layer;
    providing a mask layer over the SeOI region; and
    forming a first impurity level by doping the SeOI region and the bulk semiconductor region simultaneously such that the first impurity level in the SeOI region is contained within the mask layer,
    wherein at least one of the SeOI layer and the insulating layer has a thickness of at most 20 nm.

16. A hybrid semiconductor structure, comprising:
    a semiconductor-on-insulator (SeOI) region, wherein the SeOI region comprises a base substrate, an insulating layer over the base substrate, a SeOI layer over the insulating layer and a mask layer over the SeOI layer;

a bulk semiconductor region adjacent to the SeOI region;
a first impurity level in the SeOI region and the bulk semiconductor region, wherein the first impurity level in the SeOI region is contained within the mask layer; and
a second impurity level in the SeOI region and the bulk semiconductor region, wherein the second impurity level in the SeOI region is under the insulating layer and within the base substrate.

17. The hybrid semiconductor structure of claim 16, wherein the SeOI region and the bulk semiconductor region share a common base substrate.

18. The hybrid semiconductor structure of claim 17, further comprising a third impurity level in the SeOI region and the bulk semiconductor region, wherein the third impurity level in the SeOI region is below the second impurity level within the base substrate and further away from the insulating layer.

* * * * *